United States Patent [19]

Shimada et al.

[11] 3,916,217

[45] Oct. 28, 1975

[54] INTEGRATED LOGICAL CIRCUIT DEVICE

[75] Inventors: Shunji Shimada; Yoshikazu Hatsukano, both of Kodaira, Japan

[73] Assignee: Hitachi, Ltd., Japan

[22] Filed: Apr. 4, 1974

[21] Appl. No.: 458,061

[30] Foreign Application Priority Data

Apr. 4, 1973 Japan .............................. 48-37821

[52] U.S. Cl. ................ 307/208; 307/205; 307/214; 307/218; 307/269

[51] Int. Cl.$^{2}$ ............. H03K 19/08; H03K 19/30; H03K 19/40; H03K 5/13

[58] Field of Search ........... 307/205, 208, 214, 215, 307/218, 269, 270, 203, DIG. 1

[56] References Cited

UNITED STATES PATENTS

| | | | |
|---|---|---|---|
| 3,551,692 | 12/1970 | Yen | 307/205 |
| 3,694,665 | 9/1972 | Belluche | 307/208 |
| 3,737,673 | 6/1973 | Suzuki | 307/205 |
| 3,745,371 | 7/1973 | Suzuki | 307/221 C |
| 3,772,536 | 11/1973 | Grannis | 307/205 X |

OTHER PUBLICATIONS

Slonaker, "Applications of Collector Logic," Electronic Industries (pub.); pp. 76–78 & 182, 8/1965.

Hellerman, "A Catalog of Three-Variable OR-Invert and AND-Invert Logical Circuits," IEEE Trans. of Electronic Computers; pp. 198–223, 6/1963.

*Primary Examiner*—John S. Heyman
*Assistant Examiner*—L. N. Anagnos
*Attorney, Agent, or Firm*—Craig & Antonelli

[57] ABSTRACT

An integrated logical circuit device for providing a wired "OR" logic function between chips or circuit devices which include logical circuits of the ratioless type, comprises "floating" circuits and OR gate circuits which are formed within the corresponding chips or circuit devices. Each floating circuit determines the level of an output signal in dependence on a signal from the logical circuit at a prescribed time and makes its output terminal floating at another time. The OR gate circuits receive the output signal at the prescribed time and a signal from the logical circuit at the another time, to provide a wired OR circuit.

27 Claims, 8 Drawing Figures

FIG. 1 PRIOR ART
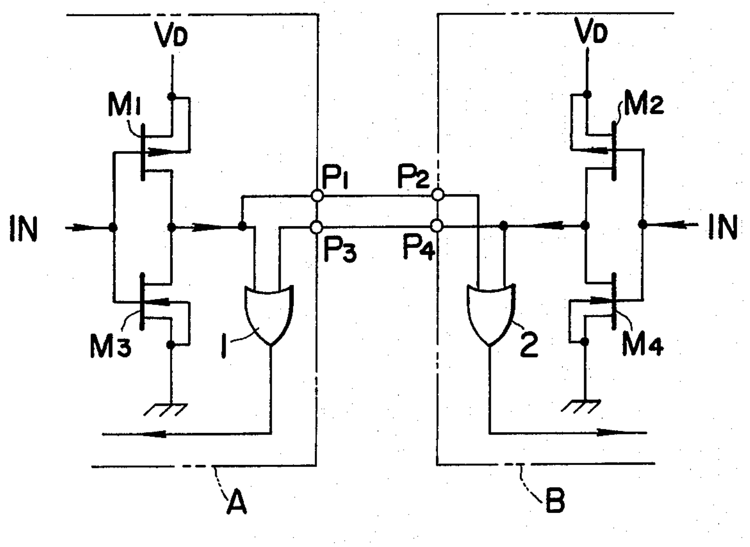
FIG. 2
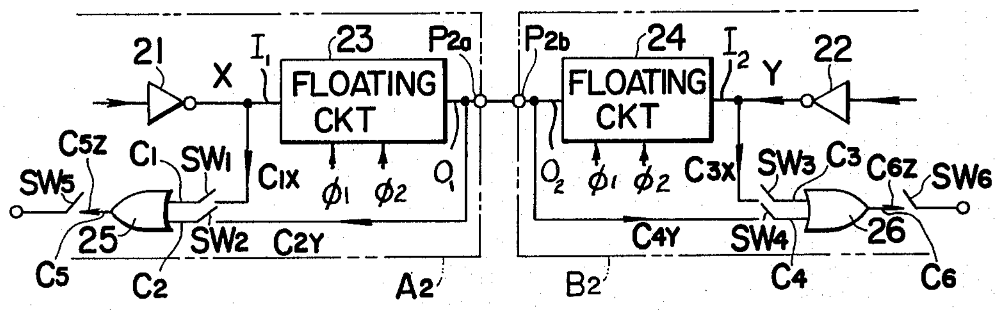
FIG. 3a
| X | | Y | | C1X | | C2Y | | C5Z | |
|---|---|---|---|---|---|---|---|---|---|
| φ1 | φ2 | φ1 | φ2 | φ1 | φ2 | φ1 | φ2 | φ1 | φ2 |
| 1 | 1 | 1 | 1 | — | 1 | 1 | 1 | — | 1 |
| 1 | 1 | 0 | 0 | — | 1 | 0 | 0 | — | 1 |
| 0 | 0 | 1 | 1 | — | 0 | 1 | 1 | — | 1 |
| 0 | 0 | 0 | 0 | — | 0 | 0 | 0 | — | 0 |
FIG. 3b
| X | | Y | | C3X | | C4Y | | C6Z | |
|---|---|---|---|---|---|---|---|---|---|
| φ1 | φ2 | φ1 | φ2 | φ1 | φ2 | φ1 | φ2 | φ1 | φ2 |
| 1 | 1 | 1 | 1 | 1 | 1 | — | 1 | — | 1 |
| 1 | 1 | 0 | 0 | 0 | 0 | — | 1 | — | 1 |
| 0 | 0 | 1 | 1 | 1 | 1 | — | 0 | — | 0 |
| 0 | 0 | 0 | 0 | 0 | 0 | — | 0 | — | 0 |

INTEGRATED LOGICAL CIRCUIT DEVICE

BACKGROUND OF THE INVENTION

1. Field of the Invention:

The present invention relates to an integrated logical circuit device and, more particularly, to a method of constructing a wired OR logical circuit between digital integrated circuit devices.

2. Description of the Prior Art:

In a digital LSI (large scale integrated circuit), in order to reduce the number of pins between chips and to optimize the division of logic function an "AND" function (logical product) or OR (logical sum) function has heretofore been sometimes effected by coupling the outputs of chips together. Especially, in the case of providing an OR function between the chips of an MIS (metal insulator semiconductor) LSI and supplying the output to both LSI chips, it is possible, between circuits of the ratio type, to provide a wired Or with the connection of a pair of pins by appropriate design of the $g_m$ (conductance) ratio of MISFETs. Between circuits of the ratioless type, however, signals between the chips are independent and current loops must be cut, so that a wired OR function is difficult to realize unless another circuit function is added. Even when another circuit function is added, a problem is that the number of pins between the chips must be increased.

An example in the case where a wired OR function is effected between chips, each having a complementary type MOS transistor integrated circuit device, is illustrated in FIG. 1.

Referring to the FIG., $M_1$ and $M_2$ designate P-channel MOS transistors which are operated as enhancement mode devices, while $M_3$ and $M_4$ indicate N-channel MOS transistors which are operated as enhancement mode devices. Numerals 1 and 2 denote OR gate circuits. The P-channel MOS transistor $M_1$ and the N-channel MOS transistor $M_3$ constitute a complementary type MOS semiconductor device, and are formed within an LSI chip A along with the OR gate circuit 1. Likewise, the P-channel MOS transistor $M_2$ and the N-channel MOS transistor $M_4$ constitute a complementary type MOS semiconductor device, and are formed within an LSI chip B along with the OR gate circuit 2.

The OR gate circuits 1 and 2 receive output signals from the chips A and B, and effect a wired OR function within the respective chips.

When, between the complementary type MOS transistor circuits of the ratioless type, it is intended to effect an OR function by directly connecting an output terminal of the circuit composed of the transistors $M_1$ and $M_3$ and an output terminal of the circuit composed of the transistors $M_2$ and $M_4$, an OR function may not always be realized where the output levels of both circuits are different, for example, where the transistors $M_1$ and $M_4$ are "on" and $M_2$ and $M_3$ are "off". It is, therefore, necessary to equip OR gate circuits 1 and 2 within the respective chips and to dispose pins ($P_3$, $P_4$) in addition to pins ($P_1$, $P_2$), so that the number of pins is inevitably increased.

SUMMARY OF THE INVENTION

It is, accordingly, an object of the present invention to provide an integrated logical circuit device which can effect a wired OR function for ratioless type logical circuits with the same number of pins as for ratio type logical circuits without increasing the number of pins.

In order to accomplish such an object, the present invention disposes within each chip or circuit device which has a respective ratioless logical circuit and between which the wired OR function is to be effected a floating switching means or circuit (hereinafter termed a floating circuit) which brings an output signal of the logical circuit into an active state when it transmits the output signal to the chip or circuit device on the opposite side at a prescribed time and which brings the output signal into a floating state when it receives a signal (reception signal) from the chip or circuit device on the opposite side at another time, and a logical circuit which receives the output signal and the reception signal in a time-shared sequence.

BRIEF DESCRIPTION OF THE DRAWINGS

FIG. 1 is a circuit diagram of an integrated logical circuit device for providing a wired OR function as employed in the prior art;

FIG. 2 is a circuit diagram of an integrated logical circuit device which is an embodiment of the present invention;

FIGS. 3*a* and 3*b* are truth tables illustrating the operative states of logical circuits shown in FIG. 2;

PREFERRED EMBODIMENTS OF THE INVENTION

Figure 4:
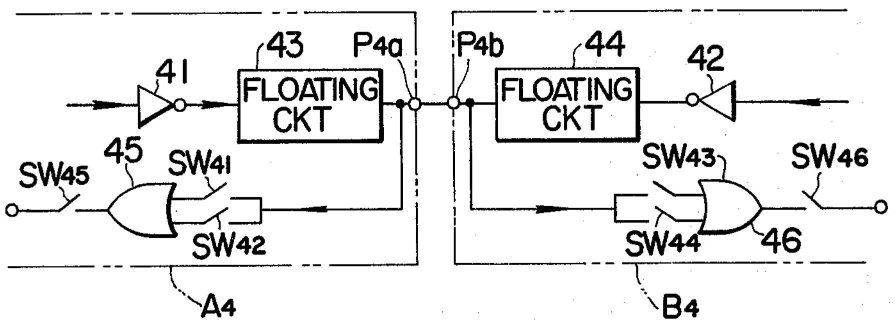
FIGS. 4 and 5 are circuit diagrams of integrated logical circuit devices which are further embodiments of the present invention.

FIG. 2 shows an integrated logical circuit device according to the present invention, especially the fundamental circuit arrangement for providing a wired OR function between LSI chips.

Referring to the figure, numerals 21 and 22 designate ratioless type logical circuits. A floating circuit 23 has such operative states that when a clock signal $\phi_1$ is applied, its output terminal $o_1$ is placed in a "floating state", and when a clock signal $\phi_2$ is applied, the signal level of the output terminal $0_1$ is determined by the signal level of its input terminal $I_1$. On the other hand, a floating circuit 24 is "active" when the clock signal $\phi_1$ is applied, and is floating when the clock signal $\phi_2$ is applied. Numerals 25 and 26 indicate OR gate circuits. Switches $SW_2$ and $Sw_3$ are synchronously closed at $\phi_1$ (opened at $\phi_2$), while switches $SW_1$, $SW_4$, $Sw_5$ and $SW_6$ are synchronously closed at $\phi_2$ (opened at $\phi_1$). $P_{2a}$ and $P_{2b}$ represent pins, and $A_2$ and $B_2$ are LSI chips.

The ratioless type logical circuit 21, the floating circuit 23, the OR gate circuit 25 and the switches ($SW_1$, $SW_2$, $SW_5$) are formed within the LSI chip $A_2$, while the ratioless type logical circuit 22, the floating circuit 24, the OR gate circuit 26 and the switches ($SW_3$, $SW_4$, $Sw_6$) are formed within the LSI chip $B_2$. These chips $A_2$ and $B_2$ are connected by a pair of pins consisting of the respective pins $P_{2a}$ and $P_{2b}$.

Within the chip $A_2$, the output terminal of the ratioless type logical circuit 21 is connected to the input terminal of the floating circuit 23, and is also connected to one of the input terminals of the OR gate circuit 25 through the switch $SW_1$. The output terminal of the floating circuit 23 is connected to the other input terminal of the OR gate circuit 25 through the switch $SW_2$, and is also connected to the pin $P_{2a}$.

Within the other chip $B_2$, the output terminal of the ratioless type logical circuit 22 is connected to the input terminal of the floating circuit 24, and is also connected to one of the input terminals of the OR gate circuit 26 through the switch $SW_3$. The output terminal of the floating circuit 24 is connected to the other input terminal of the OR gate circuit 26 through the switch $Sw_4$, and is also connected to the pin $P_{2b}$.

The operation of this device will now be explained.

Let X be the output signal of the ratioless type logical circuit 21 within the chip $A_2$, and Y be the output of the ratioless type logical circuit 22 within the chip $B_2$. The respective circuits are synchronized by the two-phase clock pulses $\phi_1$ and $\phi_2$.

The circuitry is now set so that, at the clock pulse $\phi_1$, the floating circuit 23 within the chip $A_2$ is placed in a floating state while the floating circuit 24 within the other chip $B_2$ becomes active and, at the same time, the switches $SW_1$, $SW_4$, $SW_5$ and $SW_6$ are opened while the switches $SW_2$ and $SW_3$ are closed. Then, the output signal X is not transmitted due to the opening of the switch $SW_1$ and the floating state of the floating circuit 23. In contrast, the output signal Y within the other chip $B_2$ passes through the floating circuit 24 and is transmitted to the input terminal $C_2$ of the OR gate circuit 25 via the pin $P_{2b}$ as well as the pin $P_{2a}$ of the chip $A_2$ and through the switch $SW_2$. It is accumulated within the gate circuit 25 (for example, it is accumulated in a capacitor utilizing the capacitance between the gate and source of a MOS transistor within the OR gate circuit 25). Simultaneously therewith, the output signal Y is transmitted through the switch $SW_3$ to the input terminal $C_3$ of the OR gate circuit 26 within the chip $B_2$, and is accumulated within the gate circuit (for example, accumulated in a capacitor within the OR gate circuit 26).

The circuitry is subsequently set so that, at the clock pulse $\phi_2$, the floating circuit 23 within the chip $A_2$ becomes active while the floating circuit 24 within the other chip $B_2$ is placed in a floating state and, at the same time, the switches $SW_1$, $Sw_4$, $Sw_5$ and $Sw_6$ are closed while the switches $SW_2$ and $SW_3$ are opened. Then, the output signal X passes through the floating circuit 23 and is transmitted to the input terminal $C_4$ of the OR gate circuit 26 via the pin $P_{2a}$ as well as the pin $P_{2b}$ of the chip $B_2$ and through the switch $SW_4$. Simultaneously therewith, the output signal X is transmitted through the switch $SW_1$ to the input terminal $C_1$ of the OR gate circuit 25 within the chip $A_2$ . The output signal Y is not transmitted due to the opening of the switch $SW_3$ and the floating state of the floating circuit 24.

The OR gate circuit 25 within the chip $A_2$ provides, at $\phi_2$, the signal Y accumulated during time $\phi_1$ and couples it with the output signal X at $\phi_2$, to deliver the wired OR signal from the output terminal $C_5$ of the OR gate circuit 25. Within the chip $B_2$, the OR gate circuit 26 provides, at $\phi_2$, the signal Y accumulated during time $\phi_1$ and couples it with the output signal X at time $\phi_2$, to deliver the wired OR signal from the output terminal $C_6$ of the OR gate circuit 26.

Thus, with the switches $SW_5$ and $SW_6$ synchronized with the clock pulse $\phi_2$ , the wired OR outputs can be provided from the output terminal $C_5$ of the OR gate circuit 25 within the chip $A_2$ and the output terminal $C_6$ of the OR gate circuit 26 within the chip $B_2$. Negative logic truth values at this time are shown in FIGS. *3a* and *3b*. The table of FIG. *3a* shows the truth values of the OR gate circuit 25 within the LSI chip $A_2$, while the table of FIG. *3b* shows the truth values of the OR gate circuit 26 within the LSI chip $B_2$.

In the figures, X represents the output signal of the ratioless type logical circuit 21, Y the output signal of the ratioless type logical circuit 22, $C_{1x}$ a signal flowing through the input terminal $C_1$ of the OR gate circuit 25 (in this case, the output signal X), $C_{2y}$ a signal flowing through the input terminal $C_2$ of the OR gate circuit 25 (the signal is the output signal Y and is accumulated), and $C_{5z}$ the output signal of the OR gate circuit 25. Further $C_{3x}$ represents a signal flowing through the input terminal $C_3$ of the OR gate circuit 26 (the signal is the output signal Y and is accumulated), $C_{4y}$ a signal flowing through the input terminal $C_4$ of the OR gate circuit 26 (output signal X), and $C_{6z}$ the output signal of the OR gate circuit 26. The wired OR function is obtained by setting the output signal X at [1], [1], [0], and [0] and correspondingly setting the output signal Y at [1] [0] [1] and [0] and by bringing them into synchronism with the clock pulse $\phi_2$.

As is shown in FIG. 4, another construction of the present invention consists in an integrated logical circuit device which has the foregoing principal construction. Formed within a chip $A_4$ are a ratioless type logical circuit 41, a floating circuit 43 (floating state at $\phi_1$, active state at $\phi_2$), an OR gate circuit 45 and switches $SW_{41}$, $SW_{42}$ and $SW_{45}$. Formed within a chip $B_4$ are a ratioless type logical circuit 42, a floating circuit 44 (active state at $\phi_1$, floating state at $\phi_2$), an OR gate circuit 46 and switches $SW_{43}$, $SW_{44}$ and $SW_{46}$.

The floating circuit 43 is constructed of a complementary type MOS transistor circuit as shown by way of example in FIG. *6a*. In the circuit of FIG. *6a*, transistors $M_5$ and $M_7$ are driven by the clock signals $\overline{\phi_2}$ and $\phi_2$, respectively. In this case, the transistors $M_5$ and $M_7$ turn on at the application of the clock signal $\phi_2$. As a consequence, the voltage level of the output terminal $0_1$ of an inverter circuit composed of transistors $M_1$ and $M_3$ is determined in correspondence with the voltage level of the input terminal $I_1$ when the transistors $M_5$ and $M_7$ are in the on state, i.e., when the pulse $\phi_2$ is applied. When the transistors $M_5$ and $M_7$ are in the off state, the voltage level of the output terminal $O_1$ is not affected by the voltage level of the input terminal $I_1$.

As is illustrated in FIG. *6b*, the other floating circuit 44 is driven by the clock signals $\phi_1$ and $\overline{\phi_1}$.

In this embodiment, by connecting a pair of pins $P_{4a}$ and $P_{4b}$, the output signals of the ratioless type logical circuits 41 and 42 are transmitted to the OR gate circuits 45 and 46 through the respective floating circuits 43 and 44 and by synchronizing them with the clock pulses $\phi_1$ and $\phi_2$. The accumulation is made at $\phi_1$, and the wired OR logic function is obtained at $\phi_2$.

One of the switches of each pair ($SW_{41}$, $SW_{42}$) and ($SW_{43}$, $SW_{44}$) will be closed only during $\phi_1$, while the other switch will be closed only during $\phi_2$, so as to effect the transmission of the outputs of the circuits 41 and 42 to gates 45 and 46. Switches $SW_{45}$ and $SW_{46}$ are closed only at $\phi_2$.

Figure 5:
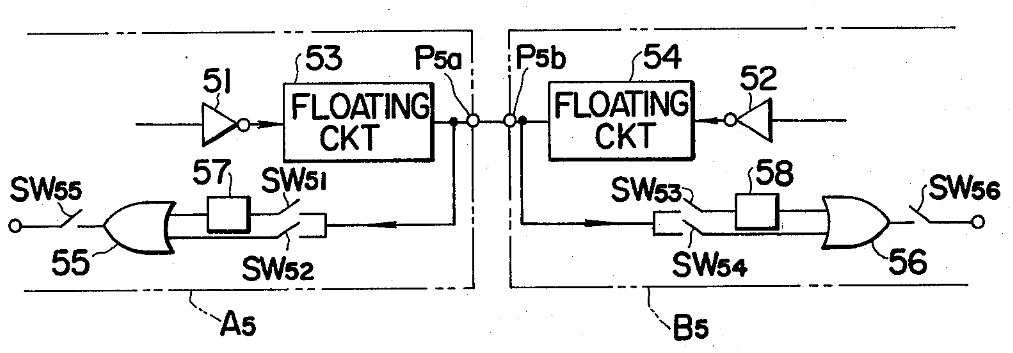
Figure 6A:
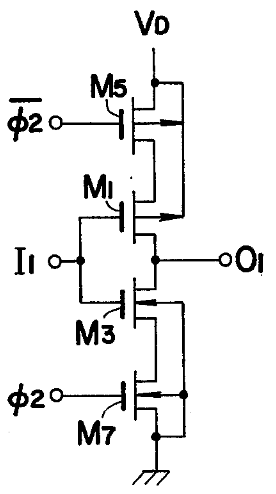
FIGS. 6*a* and 6*b* are circuit diagrams showing examples of floating circuits.
Figure 6B:
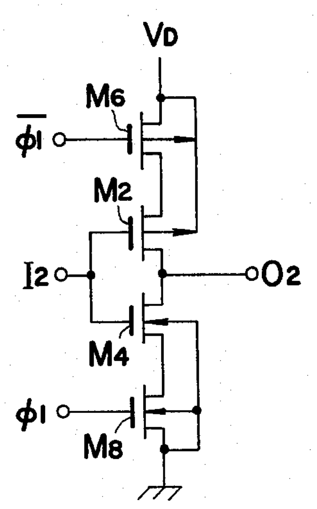

As is shown in FIG. 5, still another construction of the present invention consists in an integrated logical circuit device which has the foregoing principal construction. A ratioless type logical circuit 51, a floating circuit 53, an OR gate circuit 55, switches $SW_{51}$, $SW_{52}$ and $SW_{55}$ and a delay circuit 57 are formed within a chip $A_5$, while a ratioless type logical circuit 52, a floating circuit 54, an OR gate circuit 56, switches $SW_{53}$, $SW_{54}$ and $SW_{56}$ and a delay circuit 58 are formed within a chip $B_5$. In this case, both the chips are coupled by connection of a pair of pins $P_{5a}$ and $P_{5b}$. The delay circuit 57 within the chip $A_2$ is connected through the switch $SW_{51}$ (closed at $\phi_1$) to one of the input terminals of the OR gate circuit 55. The delay circuit 58 within the chip $B_5$ is connected through the switch $SW_{53}$ (closed at $\phi_1$) to one of the input terminals of the OR gate circuit 56. The delay circuits 57 and 58 effect the delay action which is substituted for the action of accumulating the signal at the time $\phi_1$. They provide a delay until the arrival at $\phi_2$ of the output signal of the chip $B_5$ through the switches $SW_{51}$ and $SW_{53}$ provided at $\phi_1$, and supply it to the OR gate circuits 55 and 56. Switches $SW_{52}$, $SW_{54}$, $SW_{55}$ and $SW_{56}$ are closed at $\phi_2$ for completing readout.

In the embodiments set forth above, the functions of the respective circuits can be constructed by the use of conventional digital circuits. They can be readily accomplished by, for example, connections of MOS transistors integrated within chips under the same conditions.

Accordingly, using the integrated logical circuit device of the present invention, there can be provided a circuit capable of successfully providing a wired OR function between LSI chips or circuit devices even those of the ratioless type for which a wired OR function cannot otherwise be directly provided.

The wired OR function between LSI chips or circuit devices can be achieved without increasing the number of pins, and the outputs can be put into both the chips or circuit devices.

While we have shown and described several embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What we claim is:

1. The combination comprising:

a first semiconductor integrated circuit device including a logical circuit, an external terminal, and a floating switching means for causing the logical level of said external terminal to respond to the output of said logical circuit during a first prescribed time interval;

a second semiconductor integrated circuit device including a logical circuit, an external terminal, and a floating switching means for causing the logical level of said external terminal thereof to respond to the output of said logical circuit thereof during a second prescribed time interval; and a conductor electrically connecting the external terminals of said first and second devices together, whereby the output signals of said first and second devices are conducted on the single conductor while being separated from each other in time.

2. The combination comprising:

a first semiconductor integrated circuit device including a first external terminal, a first logical circuit, and a first floating switching means having an input terminal connected to the output of said first logical circuit, an output terminal connected to said first external terminal and a control terminal to which a control signal is applied, so that a circuit path is provided during a first time interval and is not provided during a second interval between its input and output terminals, a second semiconductor integrated circuit device including a second external terminal, a second logical circuit, and a second floating switching means having an input terminal connected to the output of said second logical circuit, an output terminal connected to said second external terminal and a control terminal to which a control signal is applied, so that a circuit path is provided during said second interval and is not provided during said first time interval between its input and output terminals, and a conductor electrically connecting said first and second external terminals together, said first device further including a third logical circuit and a third switching means for providing a circuit path during said second time interval and not providing a circuit path during said first time interval between said external terminals and an input of said third logical circuit, whereby signals corresponding to the output signals of said first and second logical circuit separately appear on the single conductor during said first and second time intervals, and only the signal which corresponds to the output signal of said second logical circuit is supplied to the input of said third logical circuit during said second time interval.

3. The combination according to claim 2, wherein the signal which corresponds to the output signal of said first logical circuit is supplied to another input of said third logical circuit.

4. The combination according to claim 2, wherein the output signal of said first logical circuit is supplied to another input of third logical circuit.

5. The combination according to claim 4, wherein each of said first and second logical circuits is a ratioless type logical circuit.

6. The combination according to claim 2, wherein said first integrated circuit device further includes fourth switching means providing a circuit path during said first time interval and not providing a circuit path during said second time interval between said external terminals and another input of said third logical circuit, whereby only the signal corresponding to the output signal of said first logical circuit is supplied to said another input of said third logical circuit during said first time interval.

7. The combination according to claim 6, wherein each of said first and second logical circuits is a ratioless type logical circuit.

8. The combination according to claim 2, wherein said second integrated circuit device further includes a fourth logical circuit and fourth switching means for providing a circuit path during said first time interval and not providing a circuit path during said second time interval between said external terminals and an input of said fourth logical circuit, whereby only the signal which corresponds to the output signal of said first logical circuit is supplied to the input of said fourth logical circuit during said first time interval.

9. The combination according to claim 8, wherein the signal which corresponds to the output signal of said second logical circuit is supplied to another input of said fourth logical circuit.

10. The combination according to claim 8, wherein the output signal of said second logical circuit is supplied to another input of said fourth logical circuit.

11. The combination according to claim 10, wherein each of said first and second logical circuits is a ratioless type logical circuit.

12. The combination according to claim 8, wherein said second integrated circuit device further includes fifth switching means providing a circuit path during said second time interval and not providing a circuit path during said first time interval between said externals and another input of said fourth logical circuit, whereby only the signal which corresponds to the output signal of said second logical circuit is supplied to said another input of said fourth logical circuit during said second time interval.

13. The combination according to claim 12, wherein each of said first and second logical circuits is a ratioless type logical circuit.

14. The combination according to claim 8, wherein said first and second time intervals are defined by two-phase clock pulses for periodically operating said switching means.

15. The combination according to claim 14, wherein each of said third and fourth logical circuit includes means for storing the signal applied to the input thereof.

16. The combination according to claim 2, wherein said first and second intervals are defined by two-phase clock pulses for periodically operating said switching means.

17. The combination according to claim 16, wherein said third logical circuit includes means for storing the signal applied to the input thereof.

18. The combination according to claim 2, wherein each of said first and second floating switching means comprises first and second pairs of metal-oxide-semiconductor field-effect transistors connected in series between the terminals of a power source, the transistors of said first pair being P-channel type and the transistors of said second pair being N-channel type, the gate and drain electrodes of one of the transistors of each pair being respectively connected in common to the input and output terminals of the switching means, and the gate electrode of the other transistor of each respective pair being connected to receive said control signal which consists of a pulse and its complement pulse, so that said other transistors are simultaneously conducting or nonconducting, so as to provide or block a circuit path between the input and output terminals of the floating switching means.

19. In an integrated logic circuit including first and second integrated circuit devices, each of which includes a logic circuit and an external terminal, the improvement wherein said first integrated circuit device includes first floating switching means, having an input terminal coupled to the logic circuit of said first integrated circuit device, an output terminal connected to the external terminal of said first integrated circuit device, and a control terminal to which a control signal is applied, for providing a circuit path therethrough between the input and output terminals thereof during a first time interval and for inhibiting said circuit path during a second time interval;

said second integrated circuit device includes second floating switching means having an input terminal coupled to the logic circuit of a second integrated circuit device, an output terminal connected to the external terminal of said second integrated circuit device, and a control terminal to which a control signal is applied, for inhibiting a circuit path therethrough between the input and output terminals thereof during said first time interval and for providing a circuit path therethrough between the input and output terminals thereof during said second time interval; and wherein the external terminals of said first and second integrated circuit devices are electrically connected to each other by way of a conductor, whereby signals corresponding to the outputs of said logic circuits of said first and second integrated circuit devices separately appear on said conductor during said first and second time intervals.

20. The improvement according to claim 19, wherein said first integrated circuit device includes a first OR gate having first and second inputs and an output, the first input of said first OR gate being switchably connected to the connected outputs of said first and second floating switching means during said second time interval, and the second input of said first OR gate being switchably connected to the input of said first floating switching means during said first time interval; and said second integrated circuit device includes a second OR gate having first and second input and an output, the first input of said second OR gate being switchably connected to the connected outputs of said first and second floating switching means during said first time interval, and the second input of said second OR gate being switchably connected to the input of said second floating switching means during said second time interval.

21. The improvement according to claim 20, wherein each logic circuit is a ratioless type logic circuit and wherein each OR circuit has an output switch supplying the output thereof during said first time interval.

22. The improvement according to claim 20, wherein said first and second time intervals are defined by respective two-phase clock pulses.

23. The improvement according to claim 20, wherein said first time interval is delayed in time relative to said second time interval and both time intervals are repeated for each integrated circuit device, so that the inputs of each OR gate are sequentially connected to said floating switching means.

24. The improvement according to claim 20, wherein each of said OR circuits includes means for storing the signal supplied to the first and second inputs thereof.

25. The improvement according to claim 24, wherein the readout of the signal stored in each OR circuit is effected during one of said first and second time intervals.

26. The improvement according to claim 20, wherein each integrated circuit is switchably connected between the first input of the OR gate thereof and the output of the floating switching means thereof.

27. The improvement according to claim 26, wherein said first time interval is delayed in time relative to said second time interval and both time intervals are repeated for each integrated circuit device so that the inputs of each OR gate are sequentially connected to said floating switching means.

* * * * *